(12) United States Patent
Gibbs

(10) Patent No.: US 9,091,738 B2
(45) Date of Patent: Jul. 28, 2015

(54) VEHICLE BATTERY PACK CELL VOLTAGE DETERMINATION

(71) Applicant: GM Global Technology Operations LLC, Detroit, MI (US)

(72) Inventor: James C. Gibbs, Brighton, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 10 days.

(21) Appl. No.: 13/648,870

(22) Filed: Oct. 10, 2012

(65) Prior Publication Data

US 2014/0100711 A1    Apr. 10, 2014

(51) Int. Cl.
   *G01R 31/36*     (2006.01)
   *H01M 10/42*     (2006.01)
   *H02J 7/00*      (2006.01)

(52) U.S. Cl.
   CPC ......... *G01R 31/3658* (2013.01); *H01M 10/425* (2013.01); *H02J 7/0014* (2013.01); *H02J 7/0021* (2013.01); *G01R 31/3651* (2013.01); *H01M 2010/4271* (2013.01); *H01M 2220/20* (2013.01)

(58) Field of Classification Search
   None
   See application file for complete search history.

(56) References Cited

U.S. PATENT DOCUMENTS

| | | | | |
|---|---|---|---|---|
| 6,268,710 B1* | 7/2001 | Koga | | 320/116 |
| 6,486,635 B1* | 11/2002 | Matsuda et al. | | 320/134 |
| 7,528,575 B2* | 5/2009 | Murakami et al. | | 320/132 |
| 7,550,975 B2* | 6/2009 | Honda et al. | | 324/433 |
| 7,656,164 B2* | 2/2010 | Kawamura | | 324/434 |
| 7,786,701 B2* | 8/2010 | Altemose | | 320/136 |
| 8,046,181 B2* | 10/2011 | Kang et al. | | 702/63 |
| 8,058,844 B2* | 11/2011 | Altemose | | 320/118 |
| 8,143,854 B2* | 3/2012 | Maegawa et al. | | 320/125 |
| 8,175,826 B2* | 5/2012 | Kang et al. | | 702/63 |
| 8,426,047 B2* | 4/2013 | Emori et al. | | 429/61 |
| 2012/0139548 A1* | 6/2012 | Yang et al. | | 324/433 |
| 2013/0013237 A1* | 1/2013 | Sato et al. | | 702/63 |
| 2013/0187447 A1* | 7/2013 | Pyko et al. | | 307/9.1 |
| 2013/0214740 A1* | 8/2013 | Emori et al. | | 320/118 |
| 2013/0241471 A1* | 9/2013 | Arai et al. | | 320/107 |
| 2015/0012794 A1* | 1/2015 | Losh et al. | | 714/755 |

FOREIGN PATENT DOCUMENTS

KR    10-2012-0001703    *    1/2012

* cited by examiner

*Primary Examiner* — Helal A Algahaim
*Assistant Examiner* — Kelly D Williams
(74) *Attorney, Agent, or Firm* — Ingrassia Fisher & Lorenz, P.C.

(57) ABSTRACT

Methods and systems are provided that determine a voltage of a cell of a battery pack of a vehicle. A sensor is configured to measure a preliminary value of the voltage of the cell while the battery pack is being balanced. A processor is coupled to the sensor, and is configured to determine an offset from balancing of the battery pack, and calculate an adjusted value of the voltage of the cell using the preliminary value and the offset.

20 Claims, 3 Drawing Sheets

VEHICLE BATTERY PACK CELL VOLTAGE DETERMINATION

TECHNICAL FIELD

The technical field generally relates to the field of vehicles and, more specifically, to methods and systems for determining voltages of cells in battery packs of vehicles.

BACKGROUND

Certain vehicles, particularly electric vehicles and hybrid electric vehicles, utilize battery packs for power. The battery pack includes various battery cells within. As the battery pack is used and the cells age, the cells may need to be balanced with respect to their state of charge. However, such cell balancing can bias voltage measurements for the battery.

Accordingly, it is desirable to provide improved methods for determining a voltage of a cell of a battery pack of a vehicle, for example that accounts for bias in voltage values during battery cell balancing. It is also desirable to provide improved systems for such determining of a voltage of a cell of a vehicle battery pack, and for vehicles that include such methods and systems. Furthermore, other desirable features and characteristics of the present invention will be apparent from the subsequent detailed description and the appended claims, taken in conjunction with the accompanying drawings and the foregoing technical field and background.

SUMMARY

In accordance with an exemplary embodiment, a method is provided for determining a voltage of a cell of a battery pack of a vehicle. The method comprises determining an offset from balancing of the battery pack, measuring a preliminary value of the voltage of the cell while the battery pack is being balanced, and calculating, via a processor, an adjusted value of the voltage of the cell using the preliminary value and the offset.

In accordance with another exemplary embodiment, a system is provided for determining a voltage of a cell of a battery pack of a vehicle. The system comprises a sensor and a processor. The sensor is configured to measure a preliminary value of the voltage of the cell while the battery pack is being balanced. The processor is coupled to the sensor, and is configured to determine an offset from balancing of the battery pack and calculate an adjusted value of the voltage of the cell using the preliminary value and the offset.

In accordance with a further exemplary embodiment, a vehicle is provided. The vehicle includes a drive system and a control system. The drive system includes a battery pack. The control system is for the battery pack. The control system comprises a sensor and a processor. The sensor is configured to measure a preliminary value of a voltage of a cell of the battery pack while the battery pack is being balanced. The processor is coupled to the sensor, and is configured to determine an offset from balancing of the battery pack and calculate an adjusted value of the voltage of the cell using the preliminary value and the offset.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the disclosure or the application and uses thereof. Furthermore, there is no intention to be bound by any theory presented in the preceding background or the following detailed description.

Figure 1:
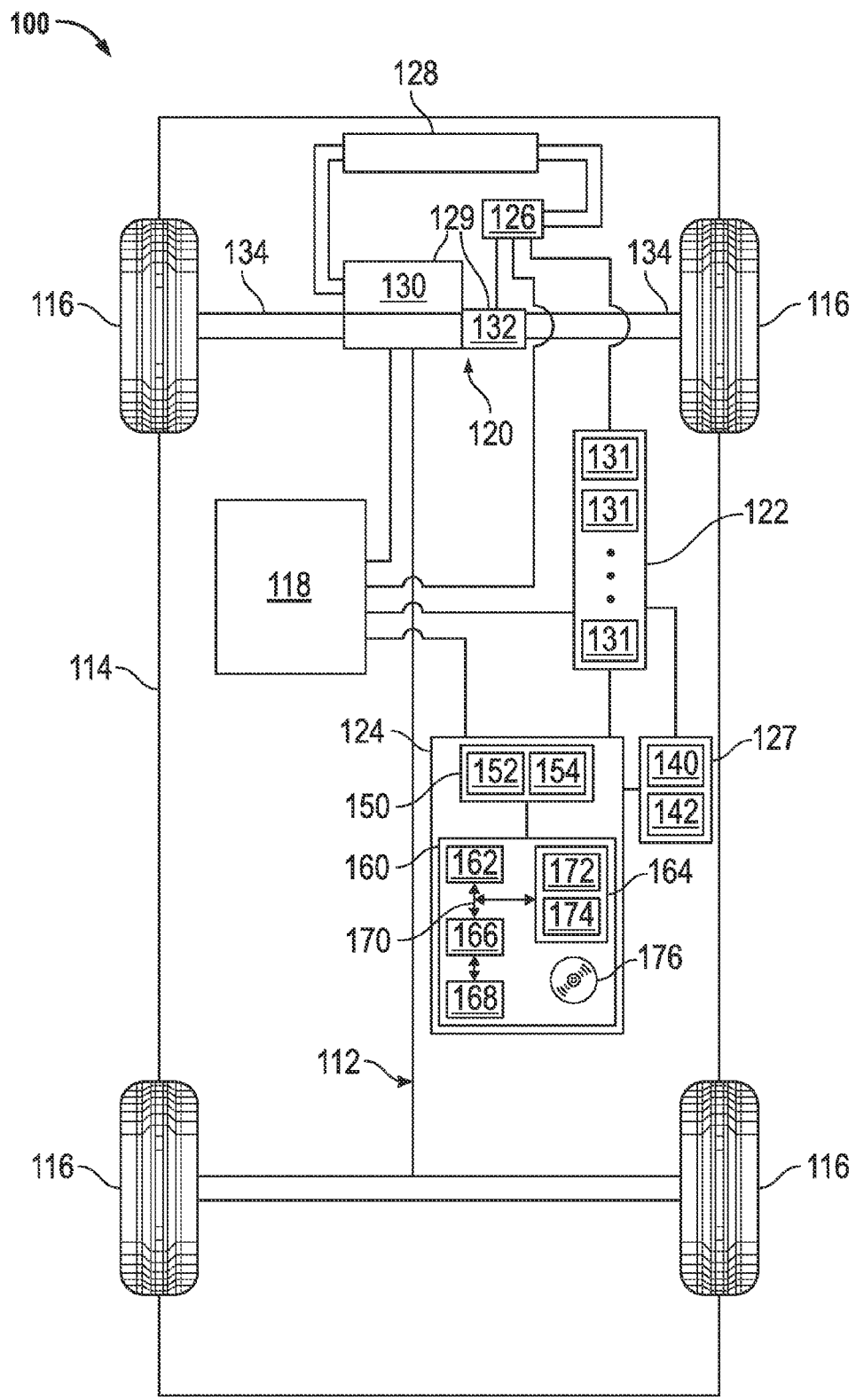
FIG. 1 is a functional block diagram of a vehicle that includes a battery pack and a control system that determines voltage values for the battery pack that are adjusting for bias while battery cells of the battery pack are being balanced, in accordance with an exemplary embodiment.

FIG. 1 illustrates a vehicle 100, or automobile, according to an exemplary embodiment. As described in greater detail further below, the vehicle 100 includes a battery pack 122 with various battery cells 131, a control system 124 for the battery pack 122, and a balancing device 127 for the battery pack 122. Among other features, the battery pack control system 124 determines voltage values for the battery pack 122 that are adjusted for biasing that may occur while the battery cells 131 are being balanced via the balancing device 127.

The vehicle 100 includes a chassis 112, a body 114, four wheels 116, and an electronic control system 118. The body 114 is arranged on the chassis 112 and substantially encloses the other components of the vehicle 100. The body 114 and the chassis 112 may jointly form a frame. The wheels 116 are each rotationally coupled to the chassis 112 near a respective corner of the body 114.

The vehicle 100 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The vehicle 100 may also incorporate any one of, or combination of, a number of different types of electrical propulsion systems, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the vehicle 100 is a hybrid electric vehicle (HEV), and further includes an actuator assembly 120, the above-referenced battery pack 122 and battery pack control system 124, a power inverter assembly (or inverter) 126, and a radiator 128. The actuator assembly 120 includes at least one propulsion system 129 mounted on the chassis 112 that drives the wheels 116.

Specifically, as depicted in FIG. 1, the actuator assembly 120 includes a combustion engine 130 and an electric motor/generator (or motor) 132. As will be appreciated by one skilled in the art, the electric motor 132 includes a transmission therein, and, although not illustrated, also includes a stator assembly (including conductive coils), a rotor assembly (including a ferromagnetic core), and a cooling fluid or coolant. The stator assembly and/or the rotor assembly within the electric motor 132 may include multiple electromagnetic poles, as is commonly understood.

Still referring to FIG. 1, the combustion engine 130 and the electric motor 132 are integrated such that one or both are mechanically coupled to at least some of the wheels 116 through one or more drive shafts 134. In one embodiment, the vehicle 100 is a "series HEV," in which the combustion engine 130 is not directly coupled to the transmission, but coupled to a generator (not shown), which is used to power the electric motor 132. In another embodiment, the vehicle 100 is a "parallel HEV," in which the combustion engine 130 is directly coupled to the transmission by, for example, having the rotor of the electric motor 132 rotationally coupled to the drive shaft of the combustion engine 130. In certain other embodiments, the vehicle 100 may comprise a pure electric vehicle, without a combustion engine 130.

The battery pack 122 is electrically connected to the inverter 126. In one embodiment, the battery pack 122 is mounted on the chassis 112. In one such embodiment, the battery pack 122 is disposed within a cockpit of the vehicle. In another embodiment, the battery pack 122 is disposed underneath a cockpit of the vehicle. The battery pack 122 preferably comprises a rechargeable battery having a pack of battery cells 131. As depicted in FIG. 1, the battery pack 122 may have any number of cells 131. In one embodiment, the battery pack 122 comprises a lithium iron phosphate battery, such as a nanophosphate lithium ion battery. Together the battery pack 122 and the propulsion system 129 provide a drive system to propel the vehicle 100. The battery pack 122 is controlled by the battery pack control system 124, and is balanced by the battery pack control system 124 using the above-mentioned balancing device 127, both described below.

The balancing device 127 is used to balance cells 131 of the battery pack 122. Specifically, the balancing device 127 includes one or more resistors 140 and an electric switch 142. When certain cells 131 have a relatively higher voltage or state of charge as compared with other cells 131 of the battery pack 122, the switch 142 is closed, so that current is discharged from the cells 131 with the relatively higher voltage or state of charge along the resistors 140, to thereby equalize the voltage or state of charge across each of the cells 131 in the battery pack 122. When the balancing is complete, the switch 142 is opened. The balancing of the cells 131 in the battery pack 122 is preferably controlled by the battery pack control system 124, which selectively opens and closes the electrical switch 142. In certain embodiments, some or all of the balancing device components may be part of the battery pack 122 itself and/or the battery pack control system 124.

Figure 2:
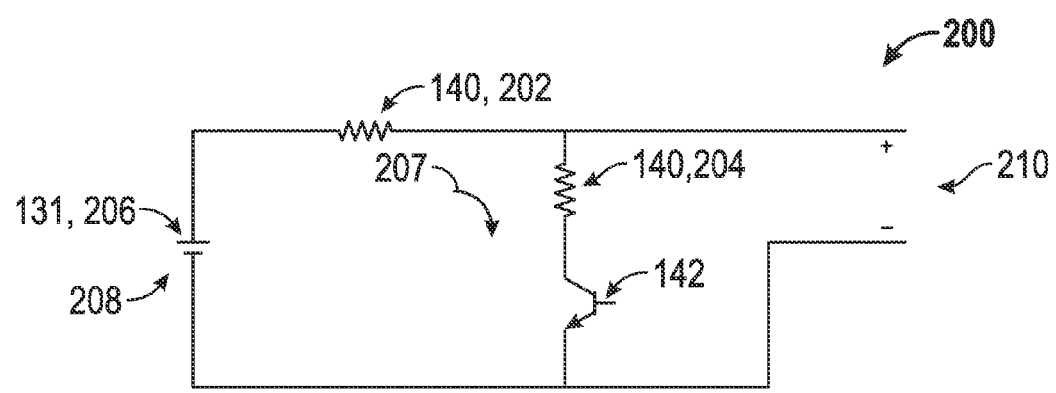
FIG. 2 is a functional schematic diagram of a system that includes a cell of the battery pack of FIG. 1, a cell balancing device for the battery pack of FIG. 1, and the control system of FIG. 1, in accordance with an exemplary embodiment.

With reference to FIG. 2, a system 200 is provided that illustrates the balancing of the cells 131 of the battery pack 122 of FIG. 1, in accordance with an exemplary embodiment. In the embodiment of FIG. 2, two resistors 140 are used, namely a first resistor 202 and a second resistor 204. When the switch 142 is closed by the battery pack control system 124 of FIG. 1 (not depicted in FIG. 2), electric current 207 from a particular cell 206 having a relatively high voltage or state of charge (as compared with other cells 131 in the battery pack 122) is discharged via the resistors 140, to balance the battery pack 122. When the balancing is complete, the switch 142 is opened by the battery pack control system 124. Accordingly, when voltage measurements are obtained during this balancing process, a measured voltage 210 for the cell 206 will differ from an actual voltage 208 for the cell 206 as a result of the current discharge, thereby resulting in bias in the voltage measurement for the cell 206 as well as for the battery pack 122 as a whole.

Returning to FIG. 1, the battery pack control system 124 is coupled to both the battery pack 122 and the balancing device 127. In certain embodiments, various components of the battery pack control system 124 may be part of the battery pack 122 and/or the balancing device 127. As depicted in FIG. 1, in certain embodiments the battery pack control system 124 may also be coupled to, and/or may be part of, the electronic control system 118.

As mentioned above, the battery pack control system 124 controls operation of the battery pack 122, including the balancing of the battery pack 122 via the balancing device 127. In addition, the battery pack control system 124 determines a voltage of the battery pack 122 that is adjusted for bias that may result from the balancing of the cells 131 of the battery pack 122, per the discussion above.

As depicted in FIG. 1, the battery pack control system 124 includes a sensor array 150 and a controller 160. The sensor array 150 includes voltage sensors 152, and in certain embodiments also includes resistance sensors 154. The voltage sensors 152 measure voltage values of the battery pack 122. While the voltage sensors 152 are depicted as being part of the battery pack control system 124, it will be appreciated that the voltage sensors 152 may be physically disposed within the battery pack 122 and/or as part of the battery pack 122. In one embodiment, a separate voltage sensor 152 is included for each cell 131 of the battery pack 122, and each voltage sensor 152 measures a voltage for the corresponding cell 131 (and is preferably disposed within or proximate such cell 131). The resistance sensors 154 measure resistance values for the resistors 140 of the balancing device 127, and may be part of the resistors 140 and/or coupled thereto.

The controller 160 is coupled to the sensor array 150, and is also preferably coupled to the battery pack 122 and the balancing device 127. In the depicted embodiment, the controller 160 is also coupled to the electronic control system 118. The controller 160 determines voltage values for the cells 131 of the battery pack 122 by adjusting the voltage values measured by the voltage sensors 152 to account for bias that may occur while the cells 131 are being balanced, in accordance with the steps of the process 300 discussed further below in connection with FIGS. 3 and 4.

As depicted in FIG. 1, the controller 160 comprises a computer system. In certain embodiments, the controller 160 may also include one or more of the voltage sensors 152, the resistance sensors 154, the battery pack 122, the balancing device 127, the electronic control system 118, and/or portions thereof, and/or one or more other devices. In addition, it will be appreciated that the controller 160 may otherwise differ from the embodiment depicted in FIG. 1. For example, the controller 160 may be coupled to or may otherwise utilize one or more remote computer systems and/or other control systems.

In the depicted embodiment, the computer system of the controller 160 comprises a computer system that includes a processor 162, a memory 164, an interface 166, a storage device 168, and a bus 170. The processor 162 performs the computation and control functions of the controller 160, and may comprise any type of processor or multiple processors, single integrated circuits such as a microprocessor, or any suitable number of integrated circuit devices and/or circuit boards working in cooperation to accomplish the functions of a processing unit. During operation, the processor 162 executes one or more programs 172 contained within the memory 164 and, as such, controls the general operation of the controller 160 and the computer system of the controller 160, preferably in executing the steps of the processes described herein, such as the steps of the process 300 described further below in connection with FIGS. 3 and 4.

The memory 164 can be any type of suitable memory. This would include the various types of dynamic random access memory (DRAM) such as SDRAM, the various types of static RAM (SRAM), and the various types of non-volatile memory (PROM, EPROM, and flash). The bus 170 serves to transmit programs, data, status and other information or signals between the various components of the computer system of the controller 160. In a preferred embodiment, the memory 164 stores the above-referenced program 172 along with one or more stored values 174 for use in determining the voltage of the battery pack 122. In certain examples, the memory 164 is located on and/or co-located on the same computer chip as the processor 162.

The interface 166 allows communication to the computer system of the controller 160, for example from a system driver and/or another computer system, and can be implemented using any suitable method and apparatus. It can include one or more network interfaces to communicate with other systems or components. The interface 166 may also include one or more network interfaces to communicate with technicians, and/or one or more storage interfaces to connect to storage apparatuses, such as the storage device 168.

The storage device 168 can be any suitable type of storage apparatus, including direct access storage devices such as hard disk drives, flash systems, floppy disk drives and optical disk drives. In one exemplary embodiment, the storage device 168 comprises a program product from which memory 164 can receive a program 172 that executes one or more embodiments of one or more processes of the present disclosure, such as the steps of the process 300 of FIGS. 3 and 4, described further below. In another exemplary embodiment, the program product may be directly stored in and/or otherwise accessed by the memory 164 and/or a disk (e.g., disk 176), such as that referenced below.

The bus 170 can be any suitable physical or logical means of connecting computer systems and components. This includes, but is not limited to, direct hard-wired connections, fiber optics, infrared and wireless bus technologies. During operation, the program 172 is stored in the memory 164 and executed by the processor 162.

It will be appreciated that while this exemplary embodiment is described in the context of a fully functioning computer system, those skilled in the art will recognize that the mechanisms of the present disclosure are capable of being distributed as a program product with one or more types of non-transitory computer-readable signal bearing media used to store the program and the instructions thereof and carry out the distribution thereof, such as a non-transitory computer readable medium storing the program and containing computer instructions stored therein for causing a computer processor (such as the processor 162) to perform and execute the program. Such a program product may take a variety of forms, and the present disclosure applies equally regardless of the particular type of computer-readable signal bearing media used to carry out the distribution. Examples of signal bearing media include: recordable media such as floppy disks, hard drives, memory cards and optical disks, and transmission media such as digital and analog communication links. It will similarly be appreciated that the computer system of the controller 160 may also otherwise differ from the embodiment depicted in FIG. 1, for example in that the computer system of the controller 160 may be coupled to or may otherwise utilize one or more remote computer systems and/or or other control systems.

The radiator 128 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the combustion engine 130 and the inverter 126.

Figure 3:
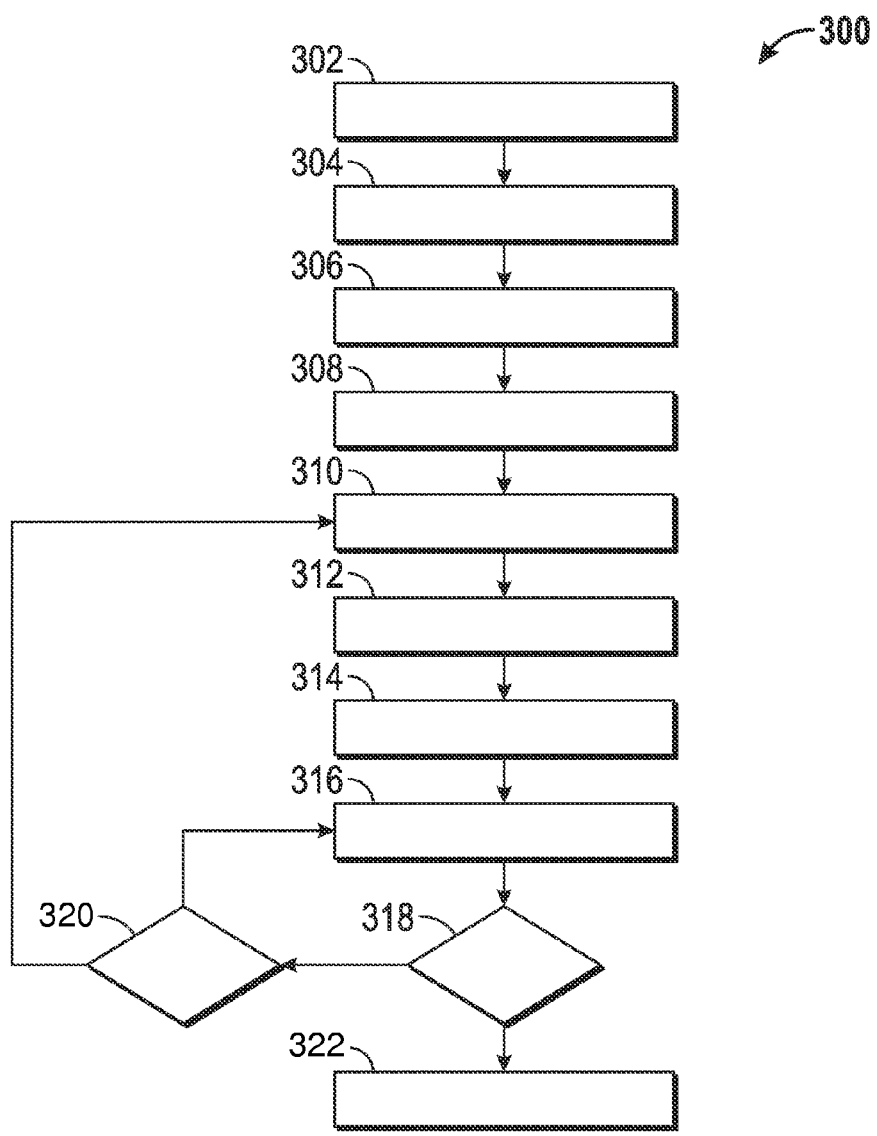
FIG. 3 is a flowchart of a process for determining voltage values for a battery pack that are adjusted for bias while battery cells of the battery pack are being balanced, and that can be used in conjunction with the vehicle, the battery pack, and the control system of FIG. 1, in accordance with an exemplary embodiment.

FIG. 3 is a flowchart of a process 300 for determining a voltage of a battery cell of a battery pack of a vehicle, in accordance with an exemplary embodiment. The process 300 adjusts the voltage for gain that may result from balancing the cells of the battery pack. The process 300 may be used in connection with the vehicle 100, battery pack 122, balancing device 127, and battery pack control system 124 of FIG. 1 and the system 200 of FIG. 2, in accordance with an exemplary embodiment.

As depicted in FIG. 3, the process 300 includes the step of measuring a first value of a voltage of a cell of the battery pack prior to a beginning of the balancing of the battery pack (step 302). As used throughout this Application, the terms balancing of the cells and balancing of the battery pack are intended to be synonymous, and to represent a balancing of the cells 131 of the battery pack 122 of FIG. 1 so that cells 131 with a relatively larger voltage or state of charge (as compared with other cells 131 of the battery pack 122) discharge electrical current via the resistors 140 of FIGS. 1 and 2 (to thereby approach equalization of the voltage or state of charge of the cells 131 of the battery pack 122 at a particular time). Preferably, the first voltage value of step 302 is measured by one or more voltage sensors 152 of FIG. 1 just prior to (preferably, no more than a few milliseconds prior to) the closing of the switch 142 of FIGS. 1 and 2 by the processor 162 of FIG. 1 in step 304, described below (i.e., so that the first voltage value of step 302 is measured while the current through the system is equal to zero).

Following the measurement of the first voltage value of step 302, the cell balancing begins (step 304). In a preferred embodiment, the processor 162 of FIG. 1 closes the switch 142 of FIGS. 1 and 2 during step 304, substantially immediately following the measurement of the first voltage of FIG. 1.

In addition, a second value of the voltage of a cell of the battery pack is measured after a beginning of the balancing of the battery pack (step 306). The second voltage value of step 306 is measured during the balancing of the battery pack. Preferably, the second voltage value of step 306 is measured by one or more voltage sensors 152 of FIG. 1 during the balancing of the battery pack, preferably just after (preferably, substantially immediately following, and no more than a few milliseconds after) the closing of the switch 142 of FIGS. 1 and 2 by the processor 162 of FIG. 1 (i.e., so that the second voltage value is measured while a non-zero current is flowing through the system).

An offset is determined for the voltage (step 308). The offset represents a correction for measured values of the voltage of the cells of the battery pack to compensate for bias that may occur while the battery pack is being balanced. In one embodiment, the voltage of step 308 is calculated by the processor 162 of FIG. 1 using the first voltage value of step 302 and the second voltage value of step 306. In one such embodiment, the processor 162 calculates the offset by subtracting the second voltage value of step 306 from the first voltage value of step 302. In certain such embodiments, the offset comprises a delta (or change) between measurements pre-balancing and during balancing of the cell, such as in Equation 1, described further below. In certain other embodiments, the offset comprises a delta (or change) between measurements taken during balancing of the cell, and is applied as a relative change to the pre-balancing measurement (i.e. V(first)), such as in Equation 2, also described further below.

A preliminary voltage value is measured for the battery pack cell (step 310). The preliminary voltage value of step 310 represents a raw voltage value measured during the cell balancing that is not yet adjusted for the bias that may occur during the cell balancing. The preliminary voltage value of step 310 is measured while the cell balancing has been proceeding for a period of time, and subsequent to the measurement of the second voltage value of step 306. In one exemplary embodiment, the preliminary voltage value of step 310 is measured approximately twenty-five milliseconds (25 msec) following the measurement of the second voltage value of step 306. The preliminary voltage value of step 310 is preferably measured by one or more of the voltage sensors 152 of FIG. 1.

In addition, in certain embodiments, resistance values are also measured for the resistors coupled to the battery cell (step 312). In one embodiment, during step 312 resistance values are measured by the resistance sensors 154 of FIG. 1 with respect to the resistors 140 of FIGS. 1 and 2, and include a first resistance value for the first resistor 202 of FIG. 2 and a second resistance value for the second resistor 204 of FIG. 2. In embodiments in which the resistance values are measured in step 312, the resistance values are preferably measured at least substantially simultaneously with the preliminary voltage value of step 310.

An adjusted voltage value is determined (step 314). The adjusted voltage value of step 314 is based on the preliminary voltage value of step 310 and the offset of step 308. The adjusted voltage value of step 314 represents an adjustment to the preliminary voltage value of step 310 based on the bias that may occur for cell voltage measurements during balancing of the battery pack. The adjusted voltage value of step 314 is preferably calculated by the processor 162 of FIG. 1. The adjusted voltage value of step 314 can be used by the battery pack control system 124 for monitoring and/or controlling the battery pack 122.

In one embodiment, the adjusted voltage value of step 314 is calculated by adding the preliminary voltage value and the offset, in accordance with the following equation:

$$V(\text{adjusted}) = V(\text{preliminary}) + \text{Offset} \quad \text{(Equation 1)},$$

in which V(adjusted) is the adjusted voltage calculated in step 314, V(preliminary) is the preliminary voltage value measured in step 310, and Offset is the voltage offset calculated in step 308.

Alternatively, the adjusted value of step 314 can be calculated in a mathematically equivalent manner in accordance with the following equation (in which the offset of step 308 is still implicitly utilized in the form of V(first)−V(second)):

$$V(\text{adjusted}) = V(\text{first}) + V(\text{preliminary}) - V(\text{second}) \quad \text{(Equation 2)},$$

in which V(adjusted) is the adjusted voltage calculated in step 314, V(first) is the first voltage value measured in step 302, V(preliminary) is the preliminary voltage value measured in step 310, and V(second) is the second voltage value measured in step 306.

In certain embodiments, the resistance values of step 312 may also be used to calculate the adjusted voltage of step 314 in a manner that accounts for the voltage drop across the first resistor 202 of FIG. 2 that is dependent on the present cell voltage, so that Equation 1 would become:

$$V(\text{adjusted}) = V(\text{preliminary}) + \text{Offset} * (R1+R2)/R2 \quad \text{(Equation 3)},$$

and Equation 2 would become:

$$V(\text{adjusted}) = V(\text{first}) + (V(\text{preliminary}) - V(\text{second})) * (R1+R2)/R2 \quad \text{(Equation 4)},$$

in which R1 is the measured resistance of the first resistor 202 of FIG. 2 and R2 is the measured resistance of the second resistor 204 of FIG. 2, from step 312.

A timer is applied (step 316). The timer is used to spread out, over time, various up-to-date voltage determinations of steps 310-314 for the battery cell during balancing of the battery pack, and also to update the offset of step 308 over time. The timer is preferably operated by the processor 162 of FIG. 1. In one embodiment the timer is used so that the voltage determinations of steps 310-314 are performed at first regular intervals spaced a first (relatively smaller) period of time apart (for example, every twenty five milliseconds), and the offset determination of steps 302-308 are performed at second regular intervals that are spaced a second (relatively larger) period of time apart (for example, every two hundred milliseconds). However, the specific time intervals used may vary in different embodiments.

A determination is made as to whether the first period of time pertaining to the offset determinations of steps 302-308 has elapsed (step 318). Specifically, in one embodiment, the determination of step 318 is made as to whether the first period of time (e.g., two hundred milliseconds in the example discussed above) has elapsed since the most recent determination of the offset in the latest iteration of step 308. This determination is preferably made by the processor 162 of FIG. 1.

If it is determined in step 318 that the first period of time has not elapsed, then a determination is made as to whether the second period of time pertaining to the voltage determinations of steps 310-314 has elapsed (step 320). Specifically, in one embodiment, the determination of step 320 is made as to whether the second period of time (e.g., twenty five milliseconds in the example discussed above) has elapsed since the most recent determination of the adjusted voltage in the latest iteration of step 314. This determination is preferably made by the processor 162 of FIG. 1.

If it is determined in step 320 that the second period of time has not elapsed, then the timer of step 316 continues until the first amount of time has elapsed. If it is determined in step 320 that the second period of time has elapsed (provided that the first period of time has not elapsed), then the process returns to step 310. Steps 310-320 then repeat in various iterations until a determination is made either (i) in step 318 that the first time period has elapsed or (ii) in step 320 that the second time period has elapsed.

During these various iterations of steps 310-320, various additional preliminary values of the voltage of the cell are measured in new iterations of step 310 at various points in time while the cell is being balanced, during the same balancing event in which the first preliminary value was measured. Similarly, various additional resistance values are measured in new iterations of step 312, and various additional adjusted voltage values are calculated in new iterations for step 314 for each of the additional preliminary values using the same offset during the same balancing event. For example, in the above example in which the second period of time is twenty five milliseconds, then an additional preliminary value is measured in step 310 and used to calculated a corresponding additional adjusted voltage value in step 314 every twenty five milliseconds, using the same offset of 308, throughout the duration of the balancing event.

When a determination is made in step 318 that the first amount of time has elapsed, the balancing of the battery pack is temporarily terminated (step 322). In one embodiment, during step 322 the processor 162 of FIG. 1 opens the switch 142 of FIGS. 1 and 2 temporarily, in order to calculate a new offset. While the balancing is stopped (e.g., while the switch 142 is open), the process returns to step 302. A new offset is calculated as a new balancing event begins (steps 302-308), and then various new additional preliminary voltage values are measured, and various corresponding new additional adjusted voltage values are calculated, in steps 310-320 at various points in time for this new balancing event, using the new corresponding offset for the new balancing event. In the example noted above, new offsets are calculated approximately every two hundred milliseconds (each corresponding to a new balancing event), and new preliminary voltage values are measured and adjusted voltage values determined approximately every twenty five milliseconds. However, the exact timing and/or frequency may vary in different embodiment. In addition, in a preferred embodiment, the steps of the process 300 are repeated, most preferably continuously, for each of the cells 131 of the battery pack 122 of FIG. 1.

Figure 4:
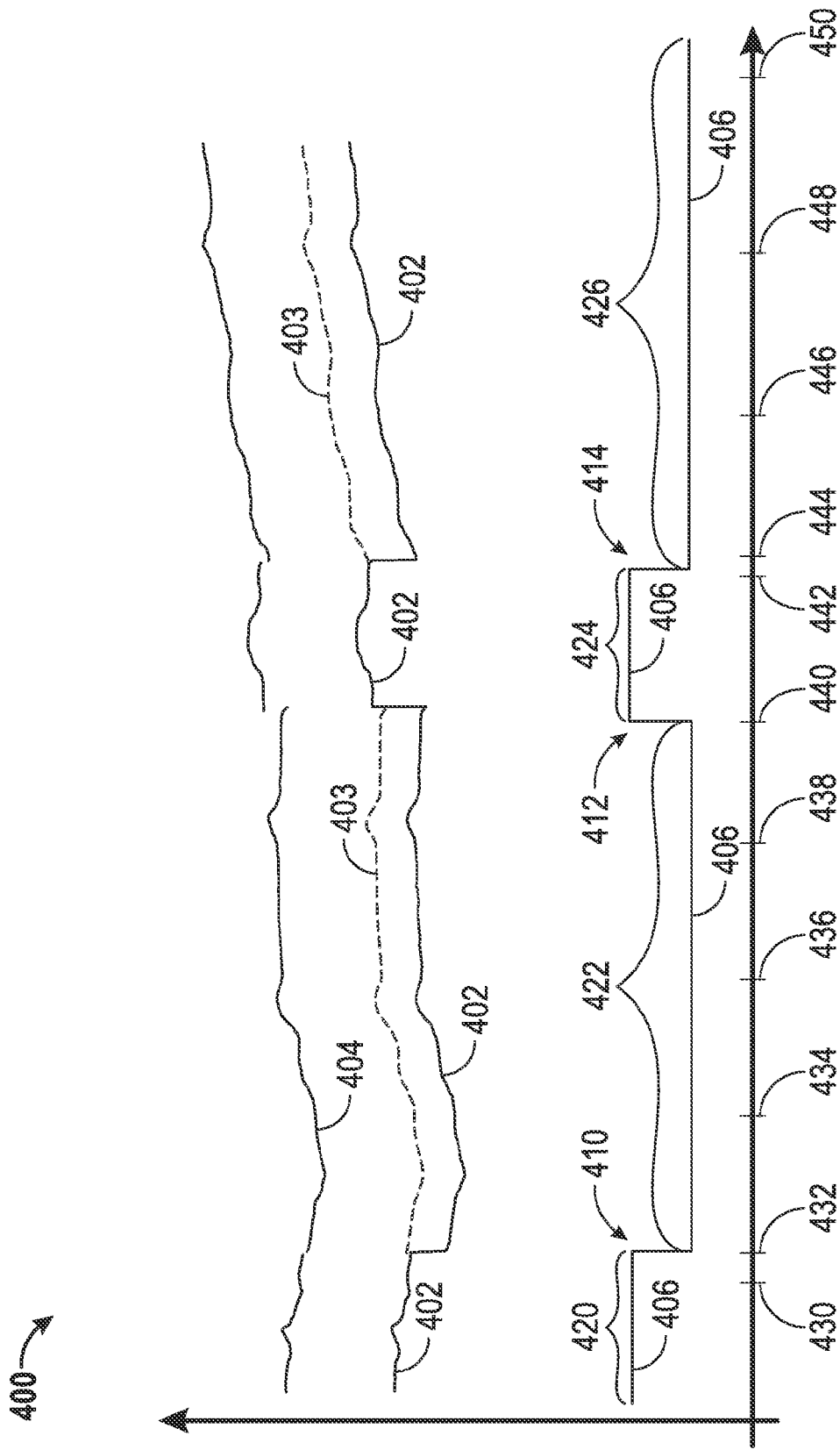
FIG. 4 is a graphical representation of certain steps of the process of FIG. 3, in accordance with an exemplary embodiment.

FIG. 4 is a graphical representation 400 of certain steps of the process 300 of FIG. 3, in accordance with an exemplary embodiment. Specifically, the graphical representation 400 displays a raw measured cell voltage 402, an adjusted cell voltage 403, an actual cell voltage 404, and a balancing switch status 406 for the process 300. As shown in FIG. 4, the raw measured voltage 402 (corresponding to the preliminary voltage value of step 310) is less than the actual voltage 404 when the cell balancing is occurring. Accordingly, while the cell balancing is occurring, the adjusted voltage 403 (corresponding to the adjusted voltage value of step 314) is closer to the actual voltage 404 (as compared with the difference between the raw measured voltage 402 and the actual voltage 404), and thus provides a more accurate voltage value while cell balancing is occurring (as compared with the raw measured voltage 402).

As shown in FIG. 4, the first voltage value (step 302) is measured at point 430 while the battery pack is in a non-balancing period 420, just before the switch is closed (step 304) at point 410 (i.e., just before balancing begins), and the second voltage value (step 306) is measured at point 432 just after the switch is closed (i.e., just after balancing begins). Various preliminary voltage values are measured (different iterations of step 310) and corresponding adjusted voltage values calculated (corresponding iterations of step 314) at points 434, 436, 438, and 440 during this same balancing event (i.e., represented as balancing event 422). The balancing event is temporarily terminated as the switch is opened (step 322) at point 412 (the balancing is not performed during time period 424).

A new offset is measured and a new balancing event begins, beginning with a new first voltage value (a new iteration of step 302) that is measured at point 442 just before the switch is closed again (a new iteration of step 304) at point 414 (i.e., just before balancing begins again), and a new second voltage value (step 306) is measured at point 444 just after the switch is closed (i.e., just after balancing begins again). Various new preliminary voltage values (step 310) are measured and corresponding adjusted voltage values calculated (step 314) at points 446, 448, and 450 during this new balancing event (i.e., represented as balancing event 426), and so on.

Accordingly, the disclosed methods, systems, and vehicles provide for potentially improved determinations of voltages for battery packs, including for cells within the battery packs. The voltage values are adjusted to compensate for bias that may occur while the battery cells are being balanced. In addition, because the offset values are updated at regular intervals (as the balancing is stopped and re-started) and actual voltage measures are used at regular intervals within each particular balancing event, the disclosed methods, systems, and vehicles provide for adjusted voltage values that are relatively current and thus potentially more accurate.

It will be appreciated that the disclosed methods, systems, and vehicles may vary from those depicted in the Figures and described herein. For example, the vehicle 100, the battery pack 122, the battery pack control system 124, the balancing device 127, and/or various components thereof may vary from that depicted in FIGS. 1 and 2 and described in connection therewith. In addition, it will be appreciated that certain steps of the process 300 may vary from those depicted in FIGS. 3 and 4 and/or described above in connection therewith. It will similarly be appreciated that certain steps of the process described above may occur simultaneously or in a different order than that depicted in FIGS. 3 and 4 and/or described above in connection therewith.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope set forth in the appended claims and the legal equivalents thereof.

I claim:

1. A method of determining a voltage of a cell of a battery pack of a vehicle, the method comprising:
    determining an offset caused from a balancing of the battery pack;
        wherein the offset represents a correction for a measured value of the voltage of the cell to compensate for a bias that occurs while the battery pack is being balanced;
    measuring, via a sensor, a preliminary value of the voltage of the cell while the battery pack is being balanced; and
    calculating, via a processor, an adjusted value of the voltage of the cell based on the preliminary value and the offset.

2. The method of claim 1, wherein:
    the step of determining the offset comprises:
        measuring a first value of the voltage prior to a beginning of the balancing of the battery pack;
        measuring a second value of the voltage after the beginning of the balancing of the battery pack; and
        calculating the offset using the first value of the voltage and the second value of the voltage; and
    the preliminary value comprises a third value of the voltage measured after the first value of the voltage and after the second value of the voltage.

3. The method of claim 2, wherein:
    the step of calculating the offset comprises subtracting the second value of the voltage from the first value of the voltage; and
    the step of calculating the adjusted value comprises adding the offset to the third value of the voltage.

4. The method of claim 2, wherein:
    the step of measuring the first value comprises measuring the first value of the voltage substantially immediately prior to closing of a switch to begin the balancing of the battery pack;

the step of measuring the second value comprises measuring the second value of the voltage substantially immediately after the closing of the switch to begin the balancing of the battery pack; and the adjusted value is calculated as being equal to the first value of the voltage plus the third value of the voltage minus the second value of the voltage.

5. The method of claim 1, wherein multiple resistors are used for balancing the battery pack, and the step of calculating the adjusted value comprises:

calculating, via the processor, the adjusted value using the preliminary value, the offset, and resistance values for the multiple resistors, wherein:

the resistance values comprise a first resistance value for a first resistor of the multiple resistors and a second resistance value for a second resistor of the multiple resistors, wherein the first resistance value and the second resistance value are both measured substantially simultaneously with the preliminary value of the voltage; and the adjusted value is calculated to be equal to the sum of a first addend plus a second addend, the first addend equal to the third value of the voltage, and the second addend being equal to a product of the offset multiplied by a multiplier, the multiplier being based on both the first resistance value and the second resistance value.

6. The method of claim 1, further comprising:

measuring a plurality of additional preliminary values of the voltage of the cell while the battery pack is being balanced, during a balancing event in which the preliminary value is measured; and calculating a respective adjusted value of the voltage of the cell for each of the plurality of additional preliminary values using a respective one of the plurality of additional preliminary values and the offset.

7. The method of claim 6, further comprising:

measuring a new plurality of additional preliminary values of the voltage of the cell while the battery pack is being balanced, during a second balancing event that is subsequent to the balancing event in which the preliminary value is measured;

determining a new offset from balancing of the battery pack for the second balancing event; and calculating a new respective adjusted value of the voltage of the cell for each of the new plurality of additional preliminary values using a respective one of the new plurality of additional preliminary values and the new offset.

8. A system for determining a voltage of a cell of a battery pack of a vehicle, the system comprising:

a sensor configured to measure a preliminary value of the voltage of the cell while the battery pack is being balanced; and a processor coupled to the sensor and configured to:

determine an offset caused from a balancing of the battery pack;

wherein the offset represents a correction for a measured value of the voltage of the cell to compensate for a bias that occurs while the battery pack is being balanced; and calculate an adjusted value of the voltage of the cell using the preliminary value and the offset.

9. The system of claim 8, wherein:

the sensor is configured to:

measure a first value of the voltage prior to a beginning of the balancing of the battery pack; and measure a second value of the voltage after the beginning of the balancing of the battery pack;

the processor is configured to calculate the offset using the first value of the voltage and the second value of the voltage; and the preliminary value comprises a third value of the voltage measured after the first value of the voltage and after the second value of the voltage.

10. The system of claim 9, wherein the processor is configured to:

calculate the offset by subtracting the second value of the voltage from the first value of the voltage; and calculate the adjusted value by adding the offset to the third value of the voltage.

11. The system of claim 9, wherein:

the sensor is configured to:

measure the first value of the voltage substantially immediately prior to closing of a switch to begin the balancing of the battery pack; and measure the second value of the voltage substantially immediately after the closing of the switch to begin the balancing of the battery pack; and the processor is configured to calculate the adjusted value as being equal to the first value of the voltage plus the third value of the voltage minus the second value of the voltage.

12. The system of claim 8, wherein multiple resistors are used for balancing the battery pack, and the processor is further configured to calculate the adjusted value using the preliminary value, the offset, and resistance values for the multiple resistors, wherein:

the resistance values comprise a first resistance value for a first resistor of the multiple resistors and a second resistance value for a second resistor of the multiple resistors, wherein the first resistance value and the second resistance value are both measured substantially simultaneously with the preliminary value of the voltage; and the adjusted value is calculated to be equal to the sum of a first addend plus a second addend, the first addend equal to the third value of the voltage, and the second addend being equal to a product of the offset multiplied by a multiplier, the multiplier being based on both the first resistance value and the second resistance value.

13. The system of claim 9, wherein:

the sensor is configured to measure a plurality of additional preliminary values of the voltage of the cell while the battery pack is being balanced, during a balancing event in which the preliminary value is measured; and the processor is configured to calculate a respective adjusted value of the voltage of the cell for each of the plurality of additional preliminary values using a respective one of the plurality of additional preliminary values and the offset.

14. The system of claim 13, wherein:

the sensor is configured to measure a new plurality of additional preliminary values of the voltage of the cell while the battery pack is being balanced, during a second balancing event that is subsequent to the balancing event in which the preliminary value is measured; and the processor is further configured to:

determine a new offset from balancing of the battery pack for the second balancing event; and calculate a new respective adjusted value of the voltage of the cell for each of the new plurality of additional preliminary values using a respective one of the new plurality of additional preliminary values and the new offset.

15. A vehicle comprising:
a drive system including a battery pack; and
a control system for the battery pack, the control system comprising:
- a sensor configured to measure a preliminary value of a voltage of a cell of the battery pack while the battery pack is being balanced; and
- a processor coupled to the sensor and configured to:
  - determine an offset caused from a balancing of the battery pack;
    - wherein the offset represents a correction for a measured value of the voltage of the cell to compensate for a bias that occurs while the battery pack is being balanced; and
  - calculate an adjusted value of the voltage of the cell using the preliminary value and the offset.

16. The vehicle of claim 15, wherein:
the sensor is configured to:
- measure a first value of the voltage prior to a beginning of the balancing of the battery pack; and
- measure a second value of the voltage after the beginning of the balancing of the battery pack;
the processor is configured to calculate the offset using the first value of the voltage and the second value of the voltage; and
the preliminary value comprises a third value of the voltage measured after the first value of the voltage and after the second value of the voltage.

17. The vehicle of claim 16, wherein:
the sensor is configured to:
- measure the first value of the voltage substantially immediately prior to closing of a switch to begin the balancing of the battery pack; and
- measure the second value of the voltage substantially immediately after the closing of the switch to begin the balancing of the battery pack; and
the processor is configured to calculate the adjusted value as being equal to the first value of the voltage plus the third value of the voltage minus the second value of the voltage.

18. The vehicle of claim 15, wherein multiple resistors are used for balancing the battery pack, and the processor is further configured to calculate the adjusted value using the preliminary value, the offset, and resistance values for the multiple resistors, wherein:
- the resistance values comprise a first resistance value for a first resistor of the multiple resistors and a second resistance value for a second resistor of the multiple resistors, wherein the first resistance value and the second resistance value are both measured substantially simultaneously with the preliminary value of the voltage; and
- the adjusted value is calculated to be equal to the sum of a first addend plus a second addend, the first addend equal to the third value of the voltage, and the second addend being equal to a product of the offset multiplied by a multiplier, the multiplier being based on both the first resistance value and the second resistance value.

19. The vehicle of claim 15, wherein:
the sensor is configured to measure a plurality of additional preliminary values of the voltage of the cell while the battery pack is being balanced, during a balancing event in which the preliminary value is measured; and
the processor is configured to calculate a respective adjusted value of the voltage of the cell for each of the plurality of additional preliminary values using a respective one of the plurality of additional preliminary values and the offset.

20. The vehicle of claim 19, wherein:
the sensor is configured to measure a new plurality of additional preliminary values of the voltage of the cell while the battery pack is being balanced, during a second balancing event that is subsequent to the balancing event in which the preliminary value is measured; and
the processor is further configured to:
- determine a new offset from balancing of the battery pack for the second balancing event; and
- calculate a new respective adjusted value of the voltage of the cell for each of the new plurality of additional preliminary values using a respective one of the new plurality of additional preliminary values and the new offset.

* * * * *